(12) United States Patent
Sung et al.

(10) Patent No.: US 11,444,063 B2
(45) Date of Patent: Sep. 13, 2022

(54) SEMICONDUCTOR PACKAGE INCLUDING VERTICAL INTERCONNECTOR

(71) Applicant: SK hynix Inc., Icheon-si (KR)

(72) Inventors: Ki Jun Sung, Icheon-si (KR); Chae Sung Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/308,718

(22) Filed: May 5, 2021

(65) Prior Publication Data
US 2022/0230994 A1    Jul. 21, 2022

(30) Foreign Application Priority Data
Jan. 20, 2021    (KR) .................. 10-2021-0007850

(51) Int. Cl.
*H01L 23/31* (2006.01)
*H01L 25/065* (2006.01)
*H01L 23/00* (2006.01)
*H01L 23/538* (2006.01)

(52) U.S. Cl.
CPC .......... *H01L 25/0657* (2013.01); *H01L 23/31* (2013.01); *H01L 23/5386* (2013.01); *H01L 24/14* (2013.01)

(58) Field of Classification Search
CPC . H01L 25/0657; H01L 23/31; H01L 23/5386; H01L 24/14
See application file for complete search history.

(56) References Cited

U.S. PATENT DOCUMENTS

2017/0373041 A1* 12/2017 Kim ................... H01L 24/32

FOREIGN PATENT DOCUMENTS

KR    1020200115298 A    10/2020

* cited by examiner

*Primary Examiner* — Trang Q Tran
(74) *Attorney, Agent, or Firm* — William Park & Associates Ltd.

(57) ABSTRACT

A semiconductor package may include: at least one semiconductor chip disposed such that an active surface on which a plurality of chip pads are disposed faces a redistribution conductive layer; a plurality of vertical interconnectors, each with one end connected to a respective chip pad, extending in a vertical direction toward the redistribution conductive layer; a molding layer covering the semiconductor chip and the vertical interconnectors while exposing another end of each of the vertical interconnectors that is not connected to the chip pad; a plurality of landing pads disposed over the molding layer, and each connected to the other end of each of the vertical interconnectors; a redistribution insulating layer covering the molding layer with an opening that collectively exposes the landing pads; and the redistribution conductive layer that extends over the molding layer and the redistribution insulating layer while being connected to each of the landing pads.

21 Claims, 17 Drawing Sheets

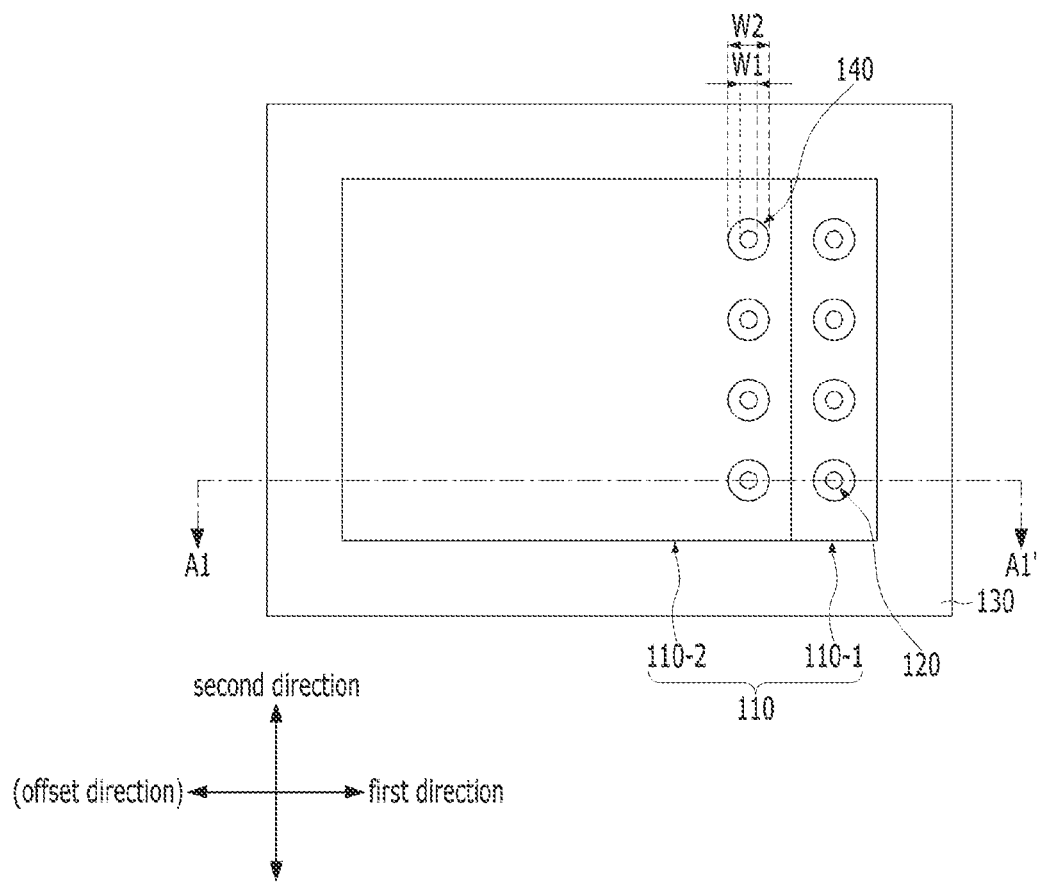

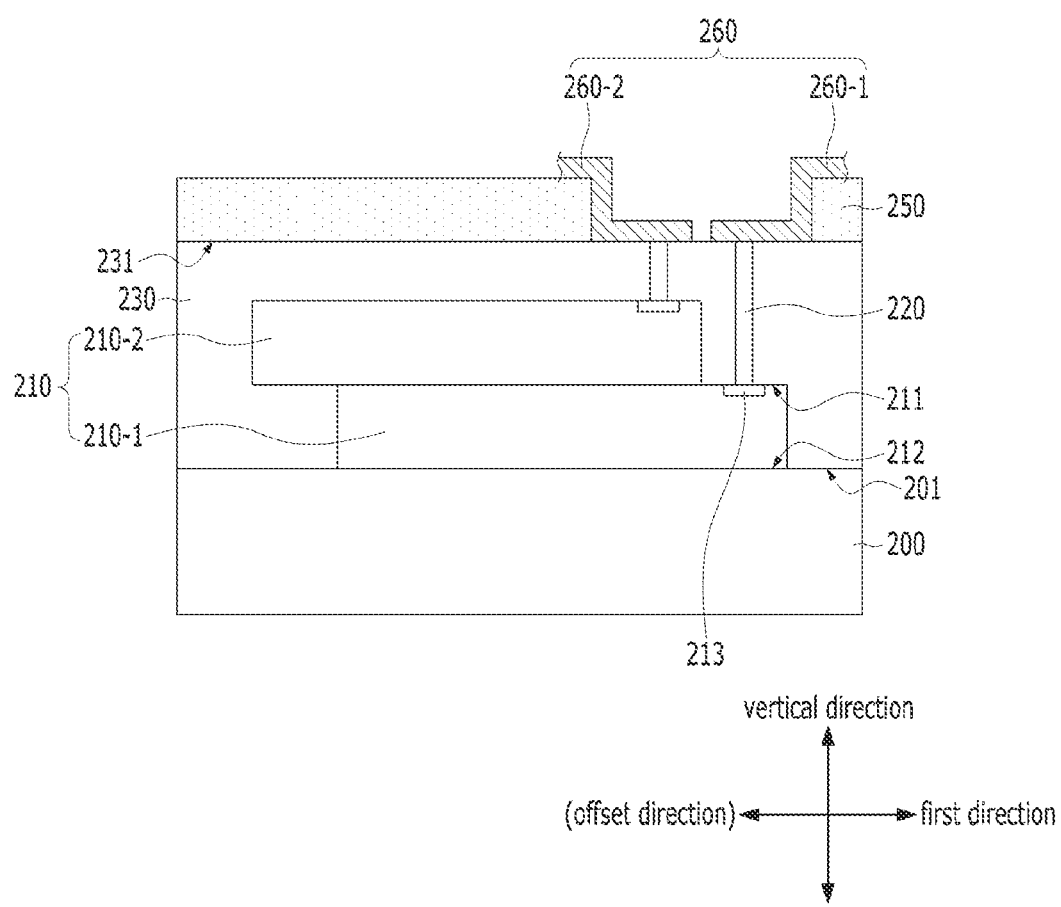

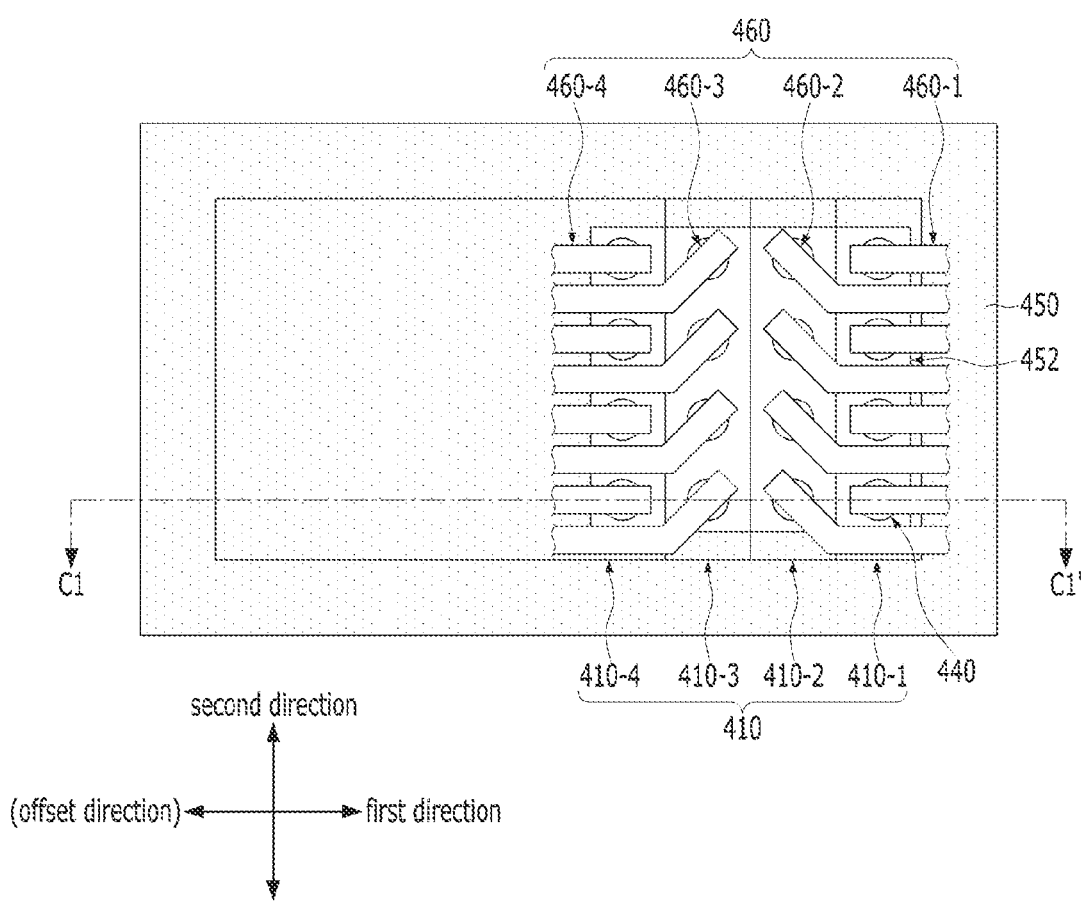

SEMICONDUCTOR PACKAGE INCLUDING VERTICAL INTERCONNECTOR

CROSS-REFERENCE TO RELATED APPLICATION

This application claims priority under 35 U.S.C. § 119 to Korean Patent Application No. 10-2021-0007850 filed on Jan. 20, 2021, which is incorporated herein by reference in its entirety.

BACKGROUND

1. Technical Field

This patent document relates to a semiconductor package, and more particularly, to a semiconductor package including a vertical interconnector.

2. Related Art

Electronic products are required to have a smaller volume while satisfying high performance/high capacity. Accordingly, semiconductor packages used in these electronic products are also required to have a specified size or less.

Recently, a fan-out package using vertical wires has been proposed. Because such a fan-out package uses a redistribution layer instead of a conventional substrate, it is possible to implement a relatively thin semiconductor package.

SUMMARY

In an embodiment, a semiconductor package may include: at least one semiconductor chip disposed such that an active surface on which a plurality of chip pads are disposed faces a redistribution conductive layer; a plurality of vertical interconnectors, each with one end connected to a respective chip pad, extending in a vertical direction toward the redistribution conductive layer; a molding layer covering the semiconductor chip and the vertical interconnectors while exposing an other end of each of the vertical interconnectors that is not connected to the chip pad; a plurality of landing pads disposed over the molding layer, and each connected to the other end of each of the vertical interconnectors; a redistribution insulating layer covering the molding layer with an opening that collectively exposes the landing pads; and the redistribution conductive layer that extends over the molding layer and the redistribution insulating layer while being connected to each of the landing pads.

In another embodiment, a semiconductor package may include: at least one semiconductor chip disposed such that an active surface on which a plurality of chip pads are disposed faces a redistribution conductive layer; a plurality of vertical interconnectors, each with one end connected to a respective chip pad, extending in a vertical direction toward the redistribution conductive layer; a molding layer covering the semiconductor chip and the vertical interconnectors while exposing an other end of each of the vertical interconnectors that is not connected to the chip pad; a redistribution insulating layer covering the molding layer with an opening that collectively exposes the other ends of the vertical interconnectors; and the redistribution conductive layer that extends over the molding layer and the redistribution insulating layer while being connected to each of the other ends of the vertical interconnectors.

BRIEF DESCRIPTION OF THE DRAWINGS

FIGS. 1A, 1B, 2A, 2B, 3A, 3B, 4A, 4B, and 5 are views illustrating a semiconductor package according to an embodiment of the present disclosure, and a method for fabricating the same.

FIGS. 6A, 6B, 7A, and 7B are views illustrating a semiconductor package according to another embodiment of the present disclosure, and a method for fabricating the same.

FIGS. 9A and 9B are views illustrating a semiconductor package according to another embodiment of the present disclosure, and a method for fabricating the same.

DETAILED DESCRIPTION

Figure 1A:
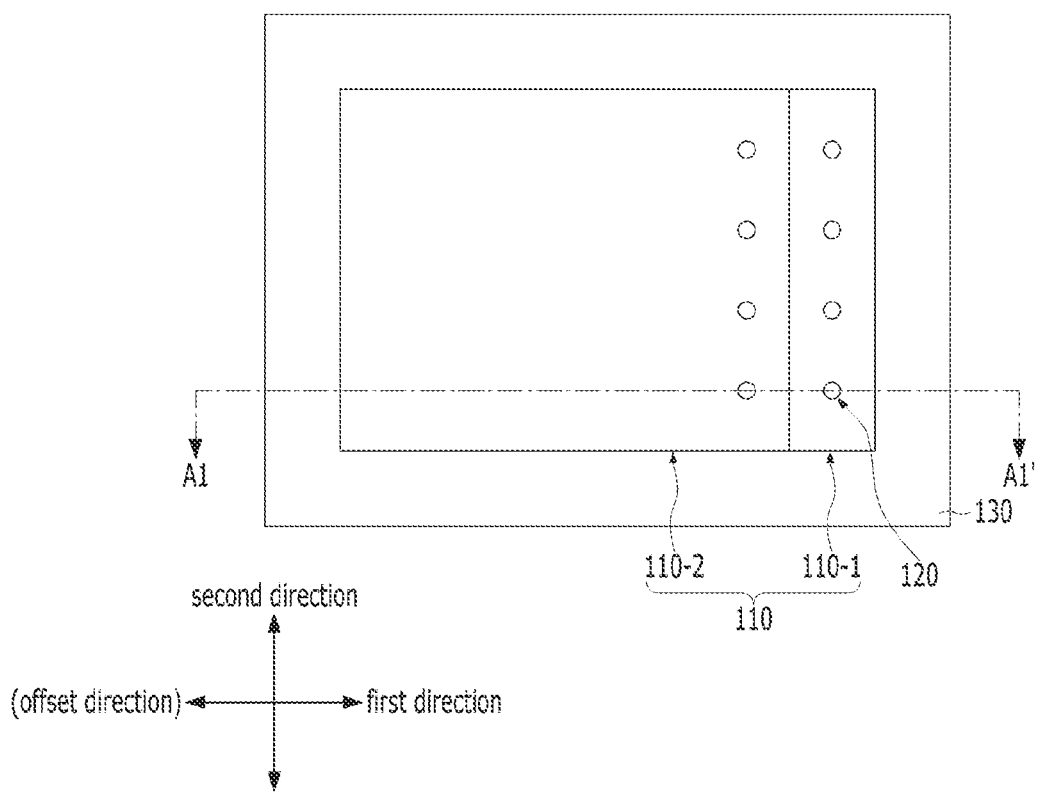

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description with two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 3A:
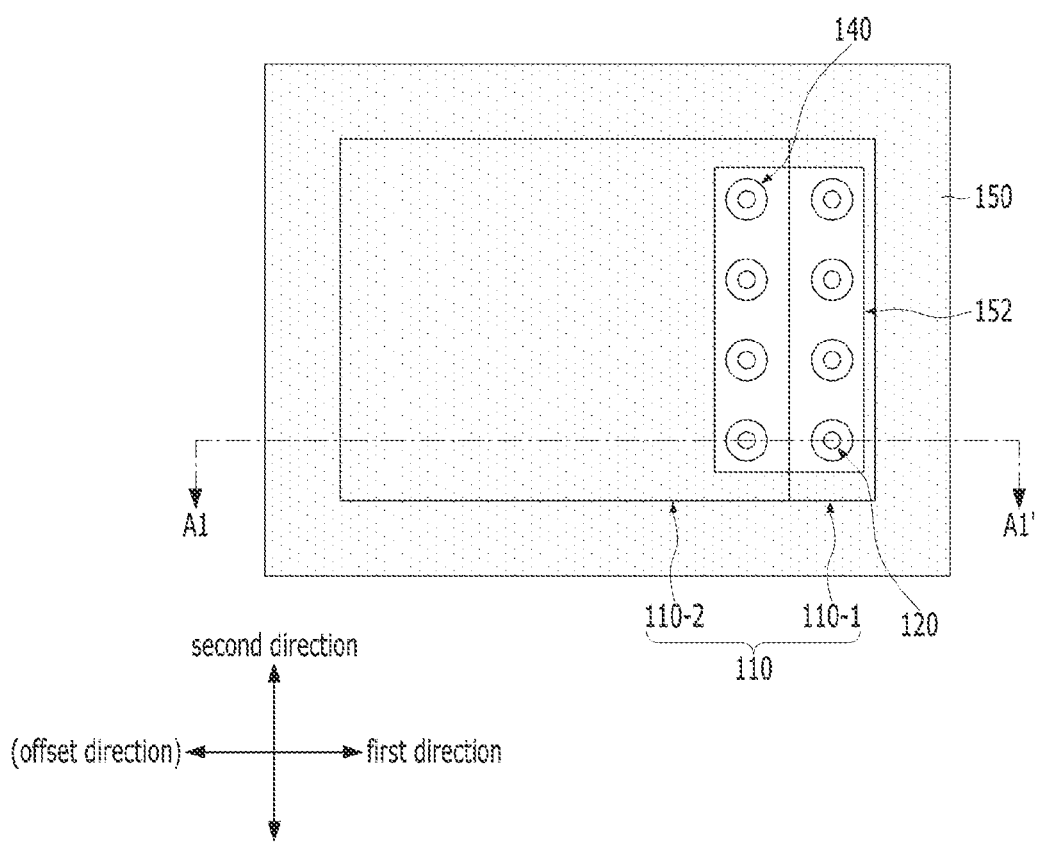
Figure 3B:
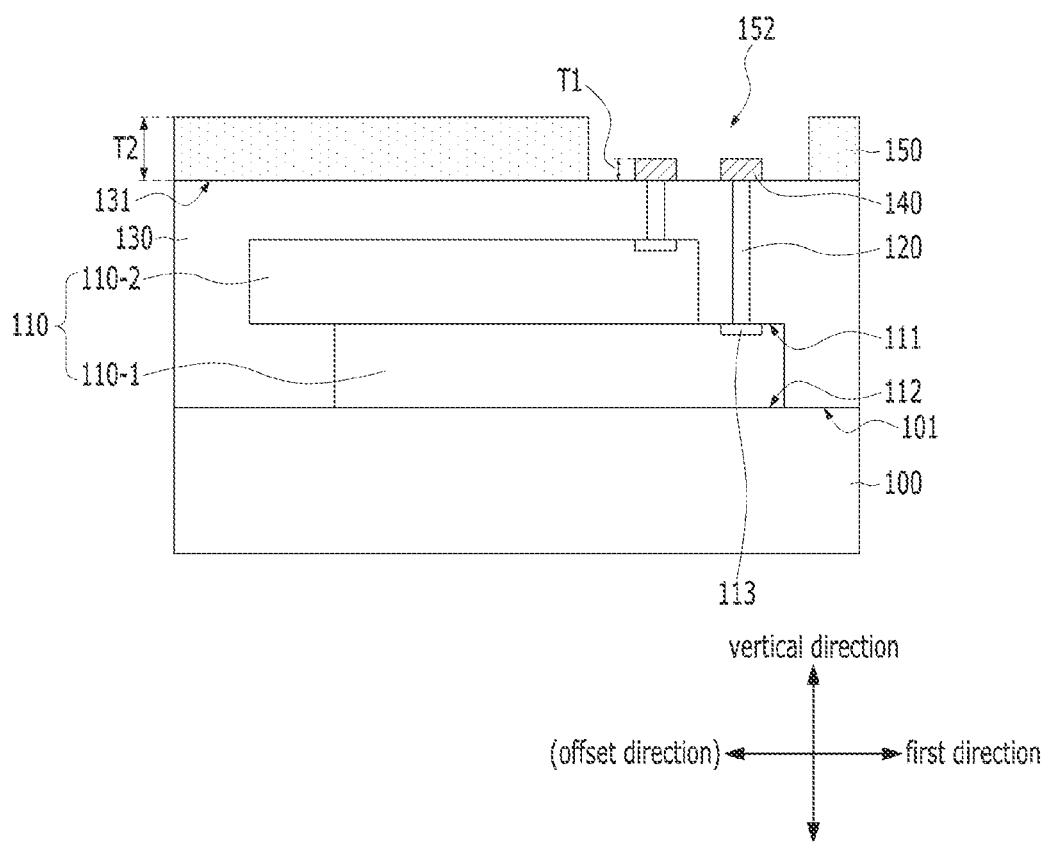
Figure 4A:
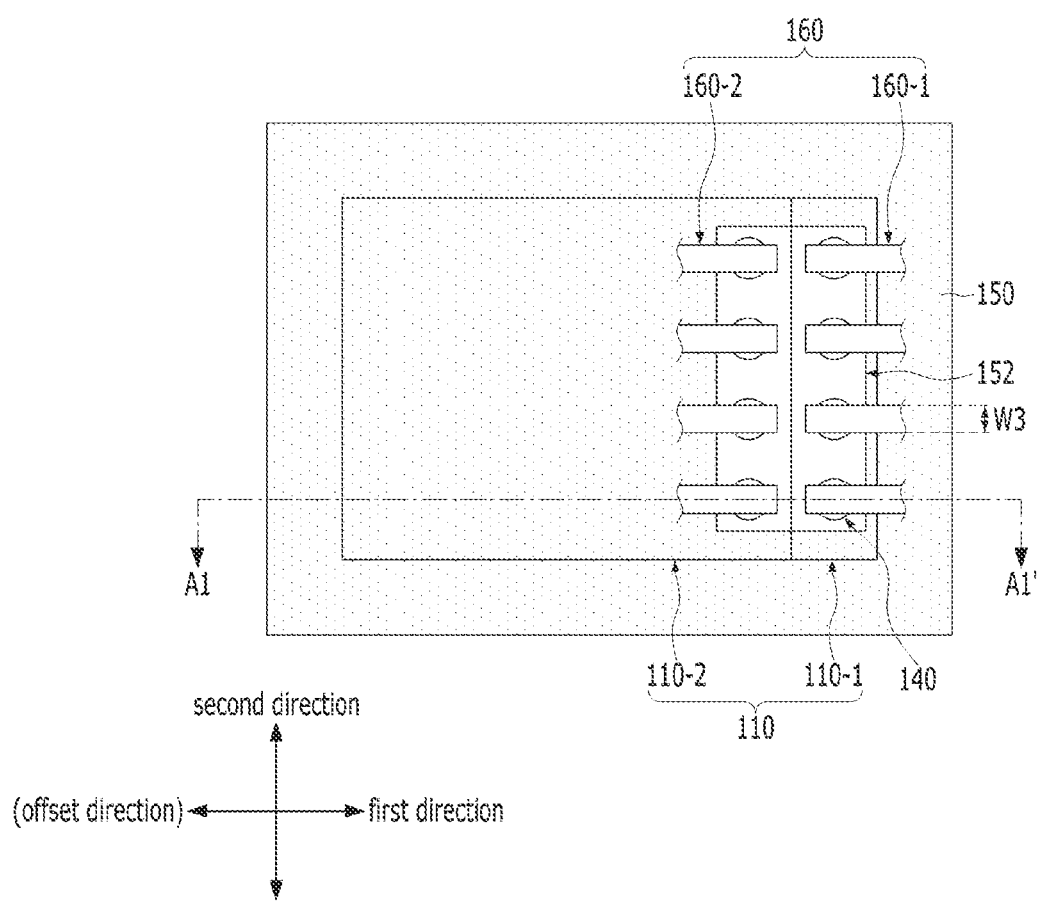
Figure 4B:
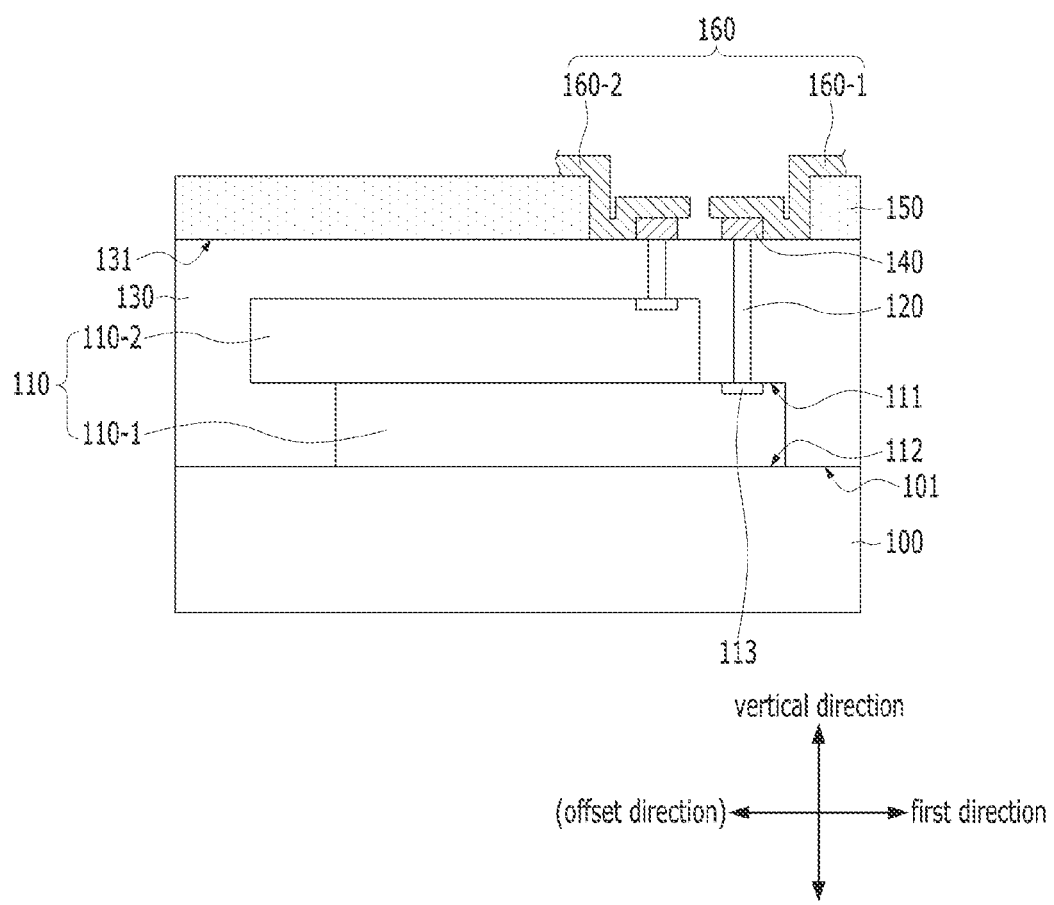
Figure 5:
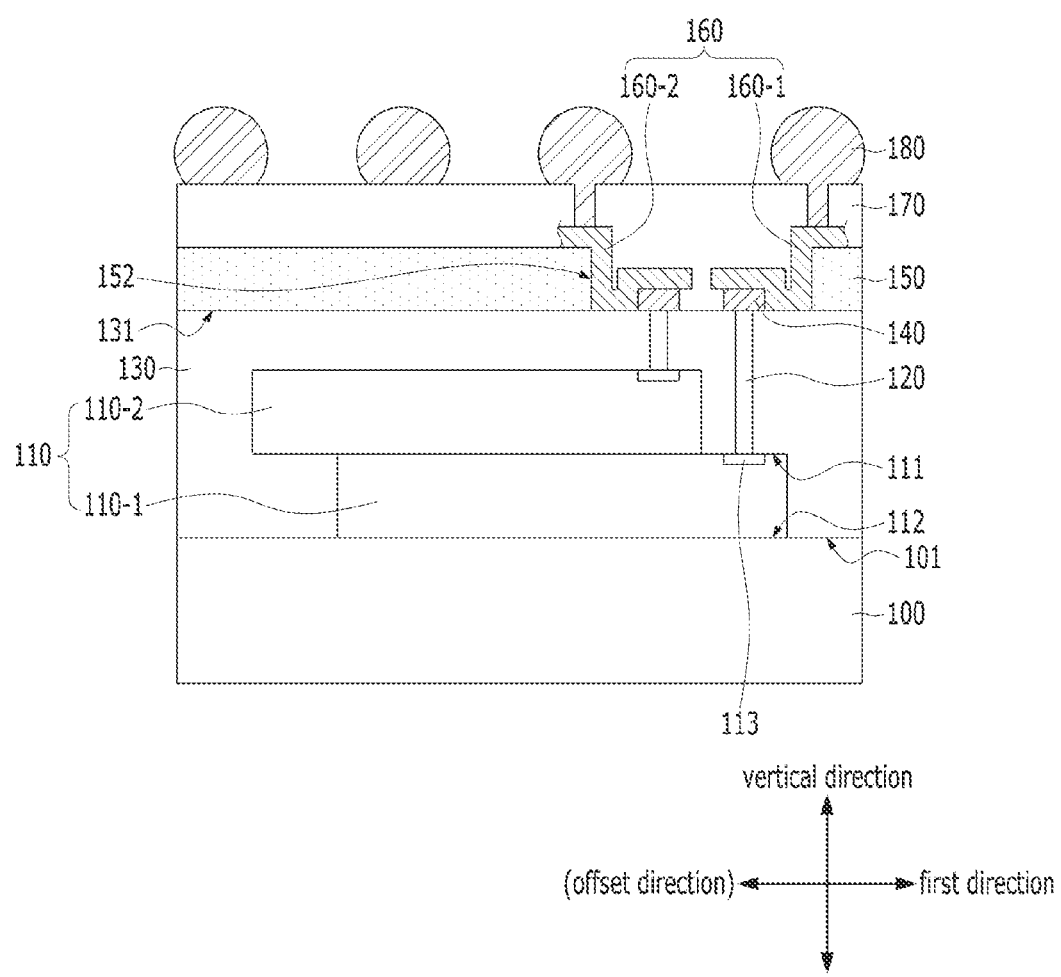

FIGS. 1A to 5 are views illustrating a semiconductor package according to an embodiment of the present disclosure, and a method for fabricating the same. Specifically, FIGS. 1A, 2A, 3A, and 4A are plan views illustrating intermediate processes in the fabricating method of the semiconductor package as viewed from an active surface direction. FIGS. 1B, 2B, 3B, and 4B are cross-sectional views respectively corresponding to FIGS. 1A, 2A, 3A, and 4A, and in particular, taken along a line A1-A1' of FIGS. 1A, 2A, 3A, and 4A. FIG. 5 is a cross-sectional view illustrating a subsequent process after the process of FIGS. 4A and 4B.

First, the fabricating method will be described.

Figure 1B:
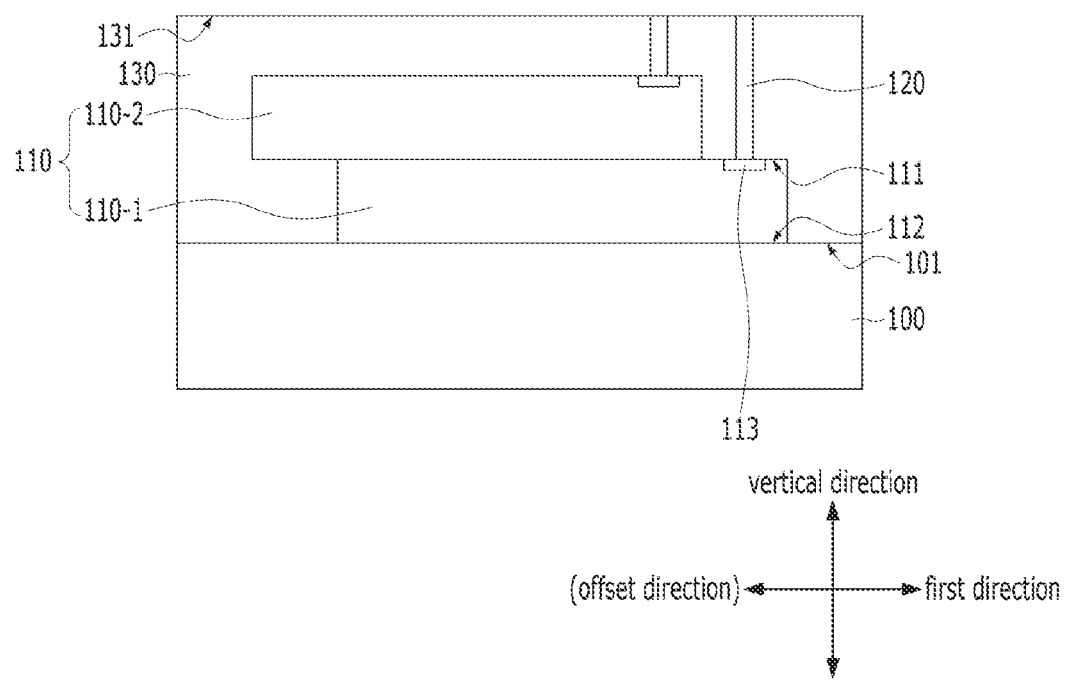

Referring to FIGS. 1A and 1B, a carrier substrate 100 may be provided. The carrier substrate 100 may be a glass carrier substrate, a silicon carrier substrate, a ceramic carrier substrate, or the like. Alternatively, the carrier substrate 100 may be a wafer, and a plurality of packages may be simultaneously implemented on the carrier substrate 100.

Subsequently, a semiconductor chip stack 110 may be formed over one surface 101 of the carrier substrate 100.

The semiconductor chip stack 110 may include a plurality of semiconductor chips 110-1 and 110-2 that are stacked in a direction that is perpendicular to the one surface 101 of the carrier substrate 100. In the present embodiment, the semiconductor chip stack 110 includes two semiconductor chips 110-1 and 110-2, but the present disclosure is not limited thereto, and the number of semiconductor chips that are included in the semiconductor chip stack 110 may be variously modified. Hereinafter, for convenience of description, the two semiconductor chips 110-1 and 110-2 will be referred to as a first semiconductor chip 110-1 and a second semiconductor chip 110-2 based on their distance from the carrier substrate 100, the semiconductor chip that is closest to the carrier substrate 100 being the first semiconductor chip 110-1.

Each of the first and second semiconductor chips 110-1 and 110-2 may have an active surface 111 on which chip pads 113 are disposed, an inactive surface 112 disposed on the opposite side of the active surface 111, and a side surface that connects the active surface 111 and the inactive surface 112. In the present embodiment, in a plan view, each of the first and second semiconductor chips 110-1 and 110-2 may have a quadrangular shape with four side surfaces in a first direction and a second direction that crosses the first direction. In addition, in the present embodiment, the chip pads 113 may be disposed in one of two edge regions of each of the first and second semiconductor chips 110-1 and 110-2 in the first direction, for example, in the right edge region. Further, although not shown, the chip pads 113 may be arranged in a row along the second direction in the edge region. However, the present disclosure is not limited thereto, and a region in which the chip pads 113 are disposed on the active surface 111 of each of the first and second semiconductor chips 110-1 and 110-2, and the arrangement of the chip pads 113 may be variously modified. For reference, although the chip pads 113 are not shown in FIG. 1A, because the chip pads 113 overlap and connect with vertical interconnectors 120 (to be described later), respectively, the arrangement of the chip pads 113 may be substantially the same as the arrangement of the vertical interconnectors 120 in a plan view.

The first and second semiconductor chips 110-1 and 110-2 may include nonvolatile memory, such as flash memory, phase-change random-access memory (PRAM), or magneto-resistive random-access memory (MRAM), volatile memory, such as dynamic random-access memory (DRAM) or static random-access memory (SRAM), non-memory, such as a logic circuit, or the like. However, the present disclosure is not limited thereto, and the first and second semiconductor chips 110-1 and 110-2 may include various types of semiconductor chips. In addition, the first semiconductor chip 110-1 and the second semiconductor chip 110-2 may include the same type of semiconductor chip or different types of semiconductor chips.

The first and second semiconductor chips 110-1 and 110-2 may be stacked over the one surface 101 of the carrier substrate 100 in a face-up manner. That is, the first and second semiconductor chips 110-1 and 110-2 may be stacked such that the inactive surface 112 of each of the first and second semiconductor chips 110-1 and 110-2 faces the one surface 101 of the carrier substrate 100 and the active surface 111 is positioned on the opposite side of the inactive surface 112. The first and second semiconductor chips 110-1 and 110-2 may be attached to the carrier substrate 100 and the first semiconductor chip 110-1, respectively, through an adhesive layer (not shown) that is formed over the inactive surface 112. In this case, the first and second semiconductor chips 110-1 and 110-2 may be stacked in an offset manner, offset in the offset direction, shown in FIG. 1B, to expose all the chip pads 113 of the first and second semiconductor chips 110-1 and 110-2. However, the present disclosure is not limited thereto, and the locations of the chip pad may be formed in various locations, and semiconductor stack may be offset in various directions.

Subsequently, the vertical interconnectors 120 that extends in a vertical direction may be formed to be connected to respective chip pads 113 of the first and second semiconductor chips 110-1 and 110-2. The vertical interconnectors 120 may have one ends that respectively overlap and connect with the chip pads 113 that are exposed by the offset stacking of the first and second semiconductor chips 110-1 and 110-2 as described above.

As an example, the vertical interconnector 120 may be a bonding wire. In this case, the vertical interconnector 120 may be formed by bonding one end of the wire to the chip pad 113 by using a wire bonding machine (not shown), pulling the bonded wire away from the carrier substrate 100, for example, from bottom to top, and cutting the wire when the wire extends to a desired length. The wire may include a metal, such as gold, silver, copper, platinum, or an alloy thereof that can be welded to the chip pad 113 through ultrasonic energy and/or heat. However, the present disclosure is not limited thereto, and as long as the vertical interconnector 120 extends from the chip pad 113 in the vertical direction, the shape and material of the vertical interconnector 120 may be variously modified.

Subsequently, a molding layer 130 that exposes the other ends of the vertical interconnectors 120, while covering the semiconductor chip stack 110 and the vertical interconnectors 120, may be formed over the one surface 101 of the carrier substrate 100. The molding layer 130 may be formed by forming a molding material that covers the semiconductor chip stack 110 and the vertical interconnectors 120, and performing a grinding process so that the other ends of the vertical interconnectors 120 are exposed. Accordingly, one surface 131 of the molding layer 130 may form a flat surface with the other ends of the vertical interconnectors 120. That is, the one surface 131 of the molding layer 130 and the other ends of the vertical interconnectors 120 may be positioned at substantially the same level in the vertical direction. On the other hand, because the one ends of the vertical interconnectors 120 that are connected to the first semiconductor chip 110-1 and the one ends of the vertical interconnectors 120 that are connected to the second semiconductor chip 110-2 are positioned at different levels in the vertical direction, the lengths of the vertical interconnectors 120 that are connected to the first semiconductor chip 110-1 may be different from the lengths of the vertical interconnectors 120 that are connected to the second semiconductor chip 110-2. The molding layer 130 may include a thermosetting resin such as EMC (Epoxy Mold Compound).

Figure 2B:
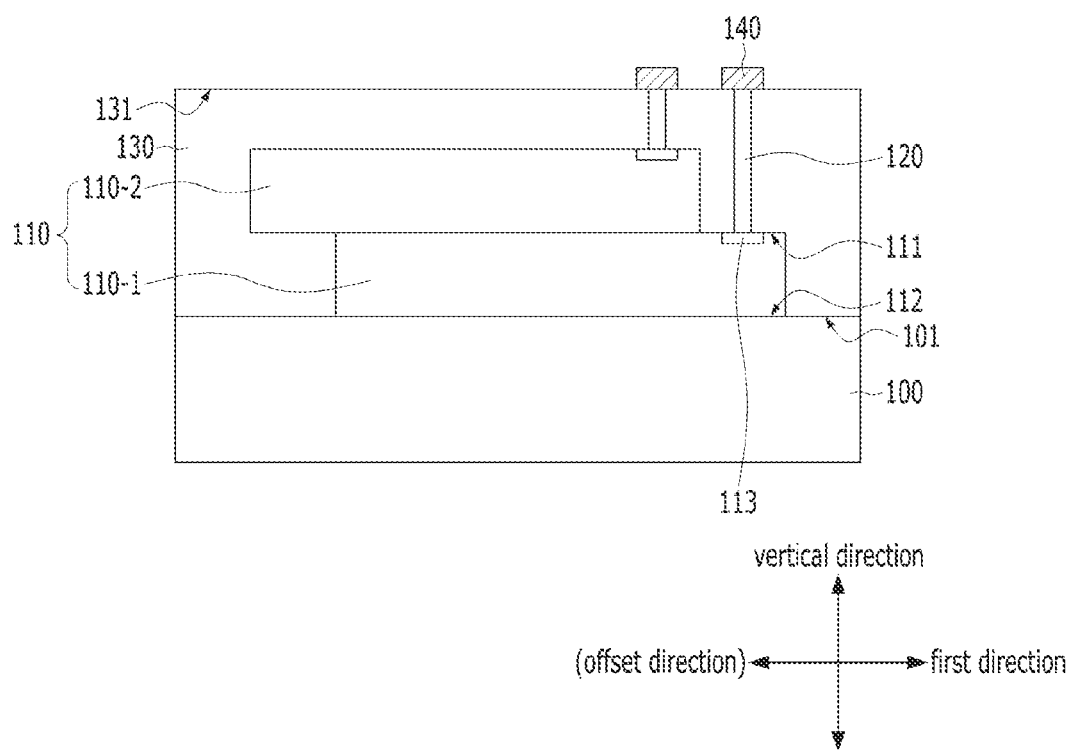

Referring to FIGS. 2A and 2B, landing pads 140 that respectively overlaps and connects with the other ends of the vertical interconnectors 120 may be formed over the one surface 131 of the molding layer 130. The landing pad 140 may directly contact the other end of the vertical interconnector 120 and may fully cover the other end of the vertical interconnector 120 so that the other end of the vertical interconnector 120 is not exposed.

The landing pad 140 may be inserted to facilitate connection between a redistribution conductive layer (see 160 in FIGS. 4A and 4B), to be described later, and the vertical interconnector 120. In a plan view, the landing pad 140 may have a larger size and/or width W2 than a size and/or width W1 of the vertical interconnector 120. In a plan view, the vertical interconnector 120 and the landing pad 140 are shown to have a circular shape. In this case, the width W1 of the vertical interconnector 120 and the width W2 of the landing pad 140 may correspond to a diameter of a circle. However, the present disclosure is not limited thereto, and the planar shape of the landing pad 140 may be variously modified. The landing pad 140 may include a metal, such as copper (Cu), aluminum (Al), tungsten (W), titanium (Ti), tantalum (Ta), indium (In), molybdenum (Mo), manganese (Mn), cobalt (Co), Tin (Sn), nickel (Ni), magnesium (Mg), rhenium (Re), beryllium (Be), gallium (Ga), ruthenium (Ru), or the like, or a compound of this metal.

The landing pad 140 may be formed by forming a metal material or a metal compound material over the one surface 131 of the molding layer 130 by electroplating or the like, and may be formed by patterning the metal material or the metal compound material.

Referring to FIGS. 3A and 3B, a redistribution insulating layer 150 may be formed over the one surface 131 of the molding layer 130 on which the landing pads 140 are formed. The redistribution insulating layer 150 may have an opening 152 that exposes the landing pads 140.

The redistribution insulating layer 150 may be formed by forming an insulating material that covers the landing pads 140 over the one surface 131 of the molding layer 130 by coating or the like, and may be formed by removing a part of the insulating material to form the opening 152. The redistribution insulating layer 150 may include various insulating materials, for example, silicon oxide, silicon nitride, insulating polymer, such as polyimide, epoxy, or the like. The thickness T2 of the redistribution insulating layer 150 may be greater than the thickness T1 of the landing pad 140.

The opening 152 of the redistribution insulating layer 150 may collectively expose all of the landing pads 140. Accordingly, a side surface and an upper surface of the landing pad 140 may be exposed without being covered by the redistribution insulating layer 150, and the one surface 131 of the molding layer 130 around the landing pads 140 may also be exposed. In a plan view, the opening 152 that surrounds the plurality of landing pads 140 may have a shape. As an example, in a plan view, the opening 152 may have a quadrangular shape with four side surfaces in the first direction and the second direction.

Referring to FIGS. 4A and 4B, a redistribution conductive layer 160 that overlaps and connects with each of the landing pads 140, while extending over the one surface 131 of the molding layer 130 and the redistribution insulating layer 150, may be formed over the resultant structure of FIGS. 3A and 3B.

The redistribution conductive layer 160 may be conformally formed along its lower profile. That is, the redistribution conductive layer 160 may be formed along the upper surface of the landing pad 140, the side surface of the landing pad 140, the one surface 131 of the molding layer 130, a side surface of the redistribution insulating layer 150 that is adjacent to the opening 152, and an upper surface of the redistribution insulating layer 150. Accordingly, in the vertical direction, the height of the upper surface of a portion of the redistribution conductive layer 160, which is positioned in the opening 152, may be lower than the height of the upper surface of another portion of the redistribution conductive layer 160, which is positioned outside of the opening 152 and positioned over the upper surface of the redistribution insulating layer 150.

The redistribution conductive layer 160 may include a metal, such as tungsten (W), copper (Cu), zirconium (Zr), titanium (Ti), tantalum (Ta), aluminum (Al), ruthenium (Ru), Palladium (Pd), platinum (Pt), cobalt (Co), nickel (Ni), or the like, or a compound of this metal. The redistribution conductive layer 160 may be formed by forming a metal material or a metal compound material over the resultant structure of FIGS. 3A and 3B by electroplating or the like, and patterning the metal material or the metal compound material.

Here, because the upper surface and the side surface of the landing pad 140 are exposed through the opening 152, the redistribution conductive layer 160 may be in direct contact with the upper surface and the side surface of the landing pad 140. Furthermore, the redistribution conductive layer 160 may also be in direct contact with the one surface 131 of the molding layer 130 and the redistribution insulating layer 150.

The width of the redistribution conductive layer 160 is indicated by reference numeral W3. Here, the width W3 of the redistribution conductive layer 160 may correspond to the width in a direction that is substantially perpendicular to the direction in which the redistribution conductive layer 160 extends, for example, in the second direction. The width W3 of the redistribution conductive layer 160 may be the width of a portion of the redistribution conductive layer 160, which overlaps the landing pad 140. The width W3 of the redistribution conductive layer 160 may be smaller than the width of the landing pad 140 (see W2 in FIG. 2A).

The redistribution conductive layer 160 may include a first redistribution conductive layer 160-1, connected to the landing pad 140 that is electrically connected to the first semiconductor chip 110-1, and a second redistribution conductive layer 160-2, connected to the landing pad 140 that is electrically connected to the second semiconductor chip 110-2. For convenience of description, the overall shapes of the first and second redistribution conductive layers 160-1 and 160-2 are not shown, and only the partial shapes of the first and second redistribution conductive layers 160-1 and 160-2 in the opening 152 and its periphery are shown. As an example, in the opening 152 and its periphery, the first redistribution conductive layer 160-1 may extend in a direction toward one side, for example, to the right in the first direction, and the second redistribution conductive layer 160-2 may extend in the opposite direction, for example, to the left in the first direction. This may be to prevent an electrical short between the first redistribution conductive layer 160-1 and the second redistribution conductive layer 160-2.

Although not shown, the redistribution conductive layer 160 may further extend over the redistribution insulating layer 150 to have various shapes. As an example, among the plurality of redistribution conductive layers 160 respectively connected to the plurality of landing pads 140, ones to which the same power is applied may be connected to each other over the redistribution insulating layer 150 to form PDN (Power Distribution Network). In this case, efficient power supply may be possible.

Referring to FIG. 5, an additional redistribution insulating layer 170 may be formed over the redistribution insulating layer 150 and the redistribution conductive layer 160.

The additional redistribution insulating layer 170 may be formed to have a thickness that completely fills the opening 152 while covering the redistribution insulating layer 150 and the redistribution conductive layer 160. The additional redistribution insulating layer 170 may include various insulating materials, for example, silicon oxide, silicon nitride, insulating polymer such as polyimide, epoxy, or the like, and may be formed by a coating method.

Subsequently, an external connection electrode 180 may be formed over the additional redistribution insulating layer 170. The external connection electrode 180 may penetrate the additional redistribution insulating layer 170 and may be connected to the redistribution conductive layer 160. The external connection electrode 180 may include various shapes of connection electrodes, such as solder balls.

Although not shown, one or more redistribution insulating layers and one or more redistribution conductive layers may be further interposed between the additional redistribution insulating layer 170 and the external connection electrode 180. In this case, the one or more redistribution conductive layers may electrically connect the external connection electrode 180 to the redistribution conductive layer 160.

Also, although not shown, the carrier substrate 100 may be removed. The carrier substrate 100 may be removed at any time after forming the molding layer 130.

By the processes described above, the semiconductor package of the present embodiment may be fabricated.

The semiconductor package of the present embodiment may include the semiconductor chip stack 110, the plurality of vertical interconnectors 120, the molding layer 130, the plurality of landing pads 140, the redistribution insulating layer 150, and the redistribution conductive layer 160. The semiconductor chip stack 110 may include the first and second semiconductor chips 110-1 and 110-2, which are disposed so that the active surface 111 on which the chip pads 113 are disposed faces the redistribution insulating layer 150 and the redistribution conductive layer 160, stacked in an offset manner so that the chip pads 113 are exposed. The vertical interconnectors 120 may have the one ends connected to respective chip pads 113 and may extend in the vertical direction toward the redistribution conductive layer 160. The molding layer 130 may cover the semiconductor chip stack 110 and the vertical interconnectors 120, and may have the one surface 131 that exposes the other ends of the vertical interconnectors 120. The landing pads 140 may be disposed over the one surface 131 of the molding layer 130 and may be connected to the other ends of the vertical interconnectors 120, respectively. The redistribution insulating layer 150 may cover the one surface 131 of the molding layer 130 and may have the opening 152 that collectively exposes the plurality of landing pads 140. The redistribution conductive layer 160 may be connected to each of the landing pads 140 and may extend over the one surface 131 of the molding layer 130 and the redistribution insulating layer 150.

Each of the above components of the semiconductor package has already been described in the fabricating method, and thus, detailed descriptions thereof will be omitted.

According to the above-described semiconductor package and its fabricating method, the following effects may be obtained.

First, because the plurality of semiconductor chips 110-1 and 110-2 are included in one semiconductor package, and a fan-out package is formed by using the vertical interconnectors 120 that are connected to the semiconductor chips 110-1 and 110-2, the redistribution insulating layer 150, the redistribution conductive layer 160, and the additional redistribution insulating layer 170, instead of a conventional substrate, it may be possible to implement a relatively thin semiconductor package while satisfying the demand for high performance/high capacity.

In addition, because the landing pad 140 has a larger width/size than the other end of the vertical interconnector 120 in a plan view, an alignment margin between the landing pad 140 and the vertical interconnector 120 may be increased. As a result, electrical connection between the vertical interconnector 120 and the redistribution conductive layer 160 through the landing pad 140 may be facilitated.

Further, process defects that occur in a comparative example in which a redistribution insulating layer has a plurality of openings that expose other ends of a plurality of vertical interconnectors, respectively, or a comparative example in which a redistribution insulating layer has a plurality of openings that expose upper surfaces of a plurality of landing pads, respectively, may be reduced/prevented.

Specifically, according to the comparative example, the width/size of each opening may be small in a plan view. Therefore, various process defects may occur, such as an opening failure in which the other end of the vertical interconnector or the upper surface of the landing pad is not exposed when the opening is formed, an alignment failure in which the other end of the vertical interconnector or the landing pad is not properly aligned with the opening, or the like.

On the other hand, according to the present embodiment, because the opening 152 of the redistribution insulating layer 150 collectively exposes all of the landing pads 140, the width/size of the opening 152 may be large in a plan view. Therefore, the formation process of the opening 152 may be facilitated, and opening failure may be prevented. Furthermore, because the redistribution conductive layer 160 is formed to directly contact the upper surface and side surface of the landing pad 140, an alignment margin between them may be further increased.

Figure 6A:
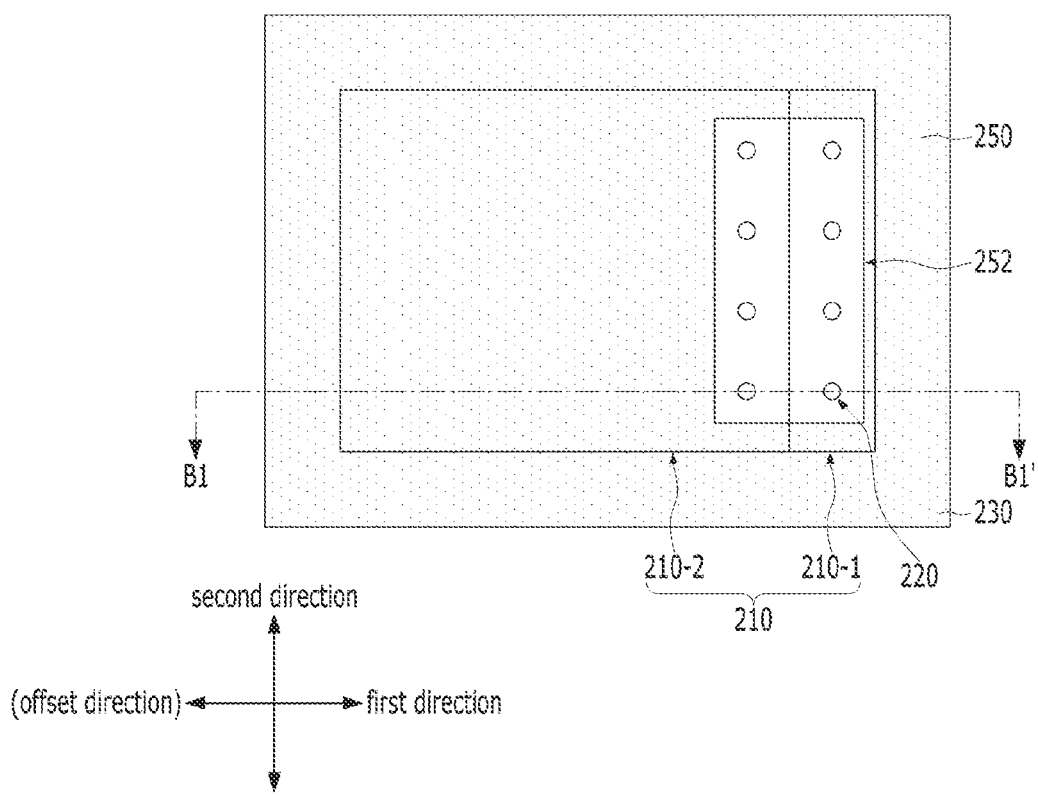
Figure 6B:
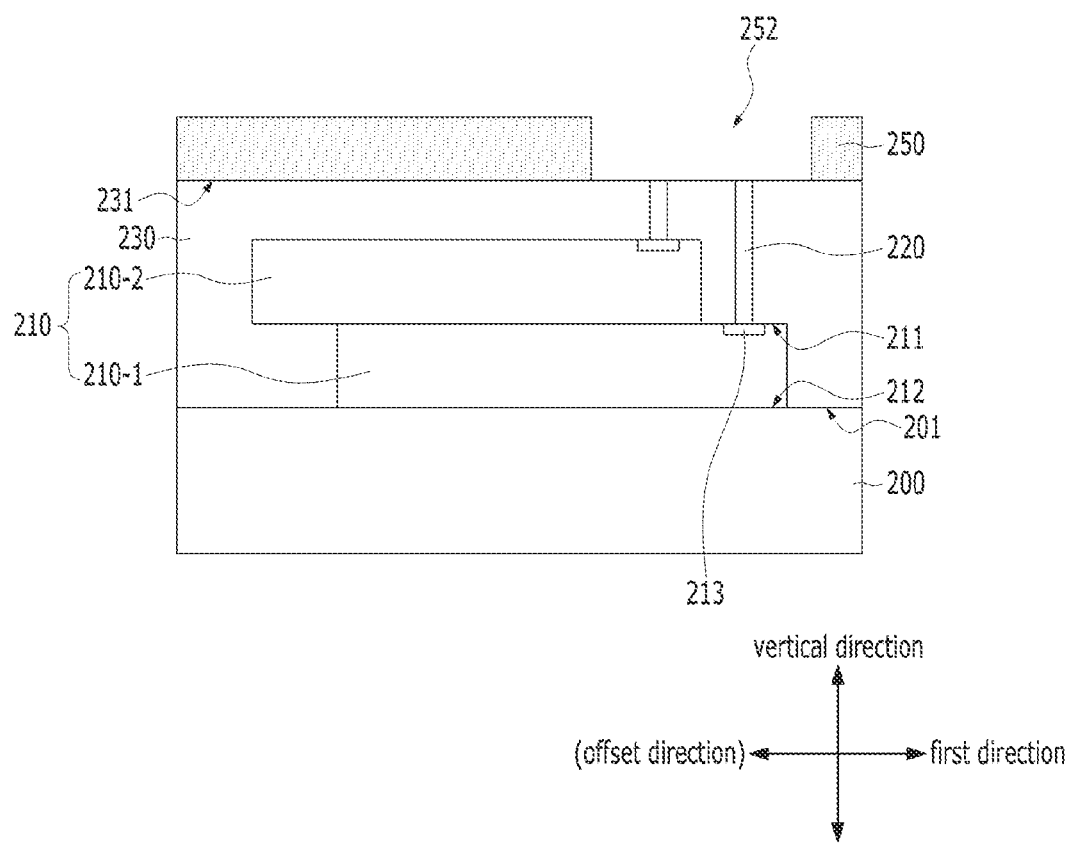
Figure 7A:
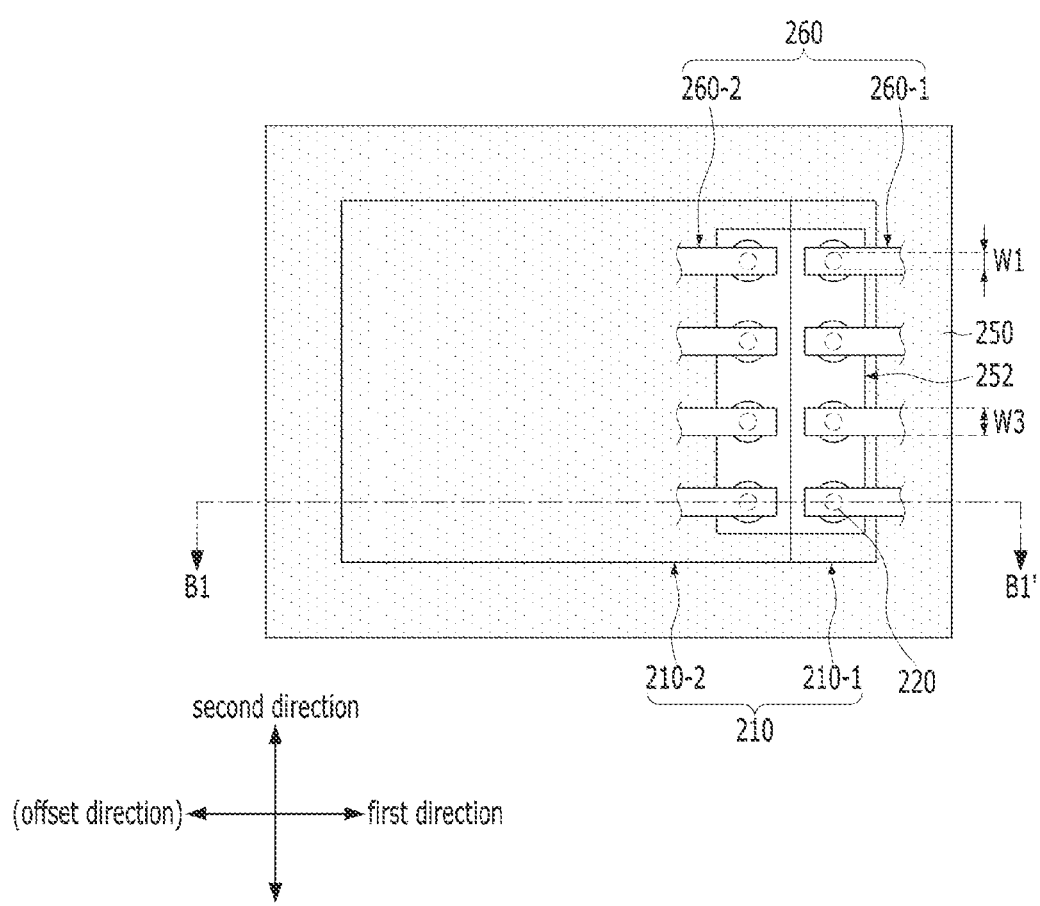

FIGS. 6A to 7B are views illustrating a semiconductor package according to another embodiment of the present disclosure, and a method for fabricating the same. Specifically, FIGS. 6A and 7A are plan views illustrating intermediate processes in the fabricating method of the semiconductor package as viewed from an active surface direction. FIGS. 6B and 7B are cross-sectional views respectively corresponding to FIGS. 6A and 7A, and in particular, taken along a line B1-B1' of FIGS. 6A and 7A. It will be described focusing on the difference from the above-described embodiment.

Referring to FIGS. 6A and 6B, a semiconductor chip stack 210 in which first and second semiconductor chips 210-1 and 210-2 are stacked in a vertical direction may be formed over one surface 201 of the carrier substrate 200. Each of the first and second semiconductor chips 210-1 and 210-2 may have an active surface 211 on which chip pads 213 are disposed, an inactive surface 212 that is disposed on the opposite side of the active surface 211, and a side surface that connects the active surface 211 and the inactive surface 212. The chip pads 213 may be disposed in one of two edge regions of each of the first and second semiconductor chips 210-1 and 210-2 in a first direction, for example, in the right edge region.

Subsequently, vertical interconnectors 220 that extends in the vertical direction with one ends respectively connected to the chip pads 213 of the first and second semiconductor chips 210-1 and 210-2 may be formed.

Subsequently, a molding layer 230 that exposes the other ends of the vertical interconnectors 220, while covering the semiconductor chip stack 210 and the vertical interconnectors 220, may be formed over the one surface 201 of the carrier substrate 200. One surface 231 of the molding layer 230 may form a flat surface with the other ends of the vertical interconnectors 220.

Subsequently, a redistribution insulating layer 250 may be formed over the one surface 231 of the molding layer 230. The redistribution insulating layer 250 may have an opening 252 that exposes the other ends of the vertical interconnectors 220.

In this case, the opening 252 of the redistribution insulating layer 250 may collectively expose all of the other ends of the vertical interconnectors 220. Accordingly, the one surface 231 of the molding layer 230, around the vertical interconnectors 220, may be exposed. In a plan view, the opening 252 that surrounds the plurality of vertical interconnectors 220 may have a shape.

Referring to FIGS. 7A and 7B, a redistribution conductive layer 260 that overlaps and connects with each of the vertical interconnectors 220, while extending over the one surface 231 of the molding layer 230 and the redistribution insulating layer 250, may be formed over the resultant structure of FIGS. 6A and 6B.

The redistribution conductive layer 260 may be in direct contact with the other end of the vertical interconnector 220. Also, the redistribution conductive layer 260 may fully cover the other end of the vertical interconnector 220 so that the other end of the vertical interconnector 220 is not exposed. To this end, in a direction that is substantially perpendicular to the extension direction of the redistribution conductive layer 260, for example, in the second direction, the width W3 of a portion of the redistribution conductive layer 260, which overlaps the vertical interconnector 220, may be greater than the width W1 of the vertical interconnector 220. Furthermore, the redistribution conductive layer 260 may be in direct contact with the one surface 231 of the molding layer 230 and the redistribution insulating layer 250.

The redistribution conductive layer 260 may include a first redistribution conductive layer 260-1, connected to the vertical interconnector 220 that is electrically connected to the first semiconductor chip 210-1, and a second redistribution conductive layer 260-2, connected to the vertical interconnector 220 that is electrically connected to the second semiconductor chip 210-2.

Subsequent processes may be substantially the same as those described in FIG. 5.

In the present embodiment, unlike the above-described embodiment, landing pads may be omitted. Accordingly, the redistribution conductive layer 260 may directly contact the vertical interconnector 220.

Meanwhile, in the embodiment of FIGS. 6A to 7B, the redistribution conductive layer 260 may have a line shape in which a portion that overlaps the vertical interconnector 220 and another portion that is adjacent thereto have a substantially constant width W3. However, the present disclosure is not limited thereto, and the width of the redistribution conductive layer 260 may be variable. This will be exemplarily described with reference to FIG. 8 below.

Figure 8:
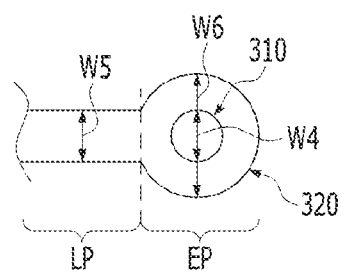
FIG. 8 is a plan view illustrating a modified example of a redistribution conductive layer.

FIG. 8 is a plan view illustrating a modified example of a redistribution conductive layer.

Referring to FIG. 8, a redistribution conductive layer 320 may include an end portion EP connected to a vertical interconnector 310, and a line portion LP with a line shape while extending in one direction from the end portion EP.

The width of the vertical interconnector 310, the width of the line portion LP, and the width of the end portion EP are denoted by reference numerals W4, W5, and W6, respectively. In this case, the width W6 of the end portion EP may be larger than the width W4 of the vertical interconnector 310 and the width W5 of the line portion LP.

In the case of the present embodiment, even if the width W4 of the vertical interconnector 310 is small, an alignment margin between the redistribution conductive layer 320 and the vertical interconnector 310 may be increased by increasing the width W6 of the end portion EP of the redistribution conductive layer 320, which overlaps the vertical interconnector 310.

Meanwhile, in the above embodiments, cases in which a semiconductor chip stack includes two semiconductor chips has been described, but the present disclosure is not limited thereto. A semiconductor chip stack may include one semiconductor chip or three or more semiconductor chips. Hereinafter, a case in which a semiconductor chip stack includes four semiconductor chips will be exemplarily described with reference to FIGS. 9A and 9B.

Figure 9B:
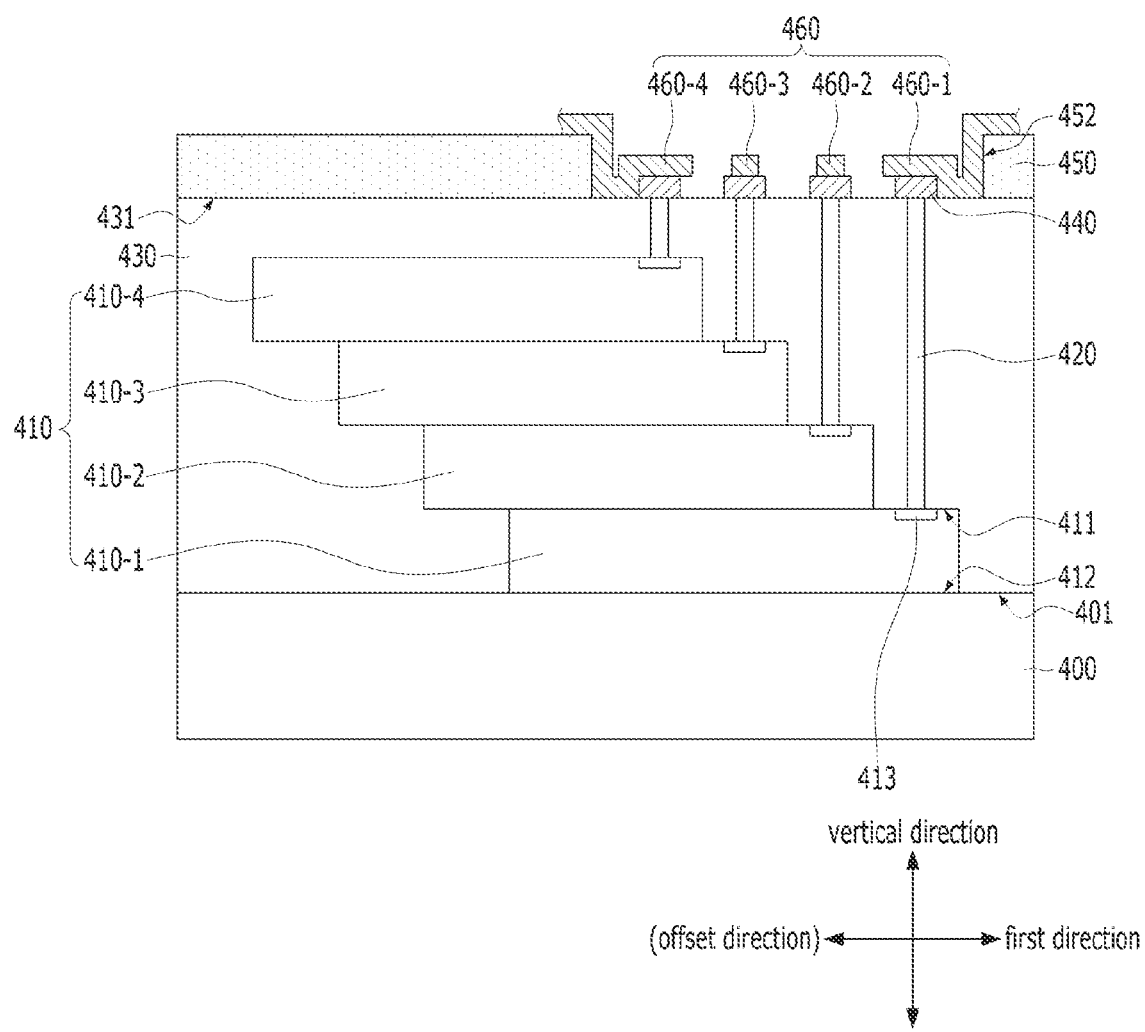

FIGS. 9A and 9B are views illustrating a semiconductor package according to another embodiment of the present disclosure, and a method for fabricating the same. Specifically, FIG. 9A is a plan view of the semiconductor package as viewed from an active surface direction. FIG. 9B is a cross-sectional view taken along a line C1-C1' of FIG. 9A. It will be described focusing on the difference from the above-described embodiments.

Referring to FIGS. 9A and 9B, a semiconductor chip stack 410 in which first to fourth semiconductor chips 410-1 to 410-4 are stacked in a vertical direction may be formed over one surface 401 of a carrier substrate 400. Each of the first to fourth semiconductor chips 410-1 to 410-4 may include an active surface 411 on which chip pads 413 are disposed, an inactive surface 412 located on the opposite side of the active surface 411, and a side surface that connects the active surface 411 and the inactive surface 412. The chip pads 413 may be disposed in one of two edge regions of each of the first to fourth semiconductor chips 410-1 to 410-4 in a first direction, for example, in the right edge region.

In this case, the first to fourth semiconductor chips 410-1 to 410-4 may be stacked in an offset manner in a direction from one side adjacent to the chip pads 413 to the other side in the first direction, for example, from right to left, so that all the chip pads 413 of the first to fourth semiconductor chips 410-1 to 410-4 are exposed.

Subsequently, vertical interconnectors 420 that extends in the vertical direction and with one ends respectively connected to the chip pads 413 of the first to fourth semiconductor chips 410-1 to 410-4 may be formed.

Subsequently, a molding layer 430 that exposes the other ends of the vertical interconnectors 420, while covering the semiconductor chip stack 410 and the vertical interconnectors 420, may be formed over the one surface 401 of the carrier substrate 400. One surface 431 of the molding layer 430 may form a flat surface with the other ends of the vertical interconnectors 420.

Subsequently, landing pads 440 that respectively overlaps and connects with the other ends of the vertical interconnectors 420 may be formed over the one surface 431 of the molding layer 430. The landing pad 440 may directly contact the other end of the vertical interconnector 420, and may fully cover the other end of the vertical interconnector 420 so that the other end of the vertical interconnector 420 is not exposed. The forming process of the landing pads 440 may be omitted.

Subsequently, a redistribution insulating layer 450 may be formed over the one surface 431 of the molding layer 430. The redistribution insulating layer 450 may have an opening 452 that collectively exposes all of the landing pads 440. When the landing pads 440 are omitted, the opening 452 may expose all of the other ends of the vertical interconnectors 420.

Subsequently, a redistribution conductive layer 460 that overlaps and connects with each of the landing pads 440, while extending over the one surface 431 of the molding layer 430 and the redistribution insulating layer 450, may be formed. The redistribution conductive layer 460 may be conformally formed along its lower profile. When the landing pads 440 are omitted, the redistribution conductive layer 460 may overlap and connect with each of the other ends of the vertical interconnectors 420.

In this case, the redistribution conductive layer 460 may include a first redistribution conductive layer 460-1, connected to the landing pad 440 that is electrically connected to the first semiconductor chip 410-1, a second redistribution conductive layer 460-2, connected to the landing pad 440 that is electrically connected to the second semiconductor chip 410-2, a third redistribution conductive layer 460-3, connected to the landing pad 440 that is electrically connected to the third semiconductor chip 410-3, and a fourth redistribution conductive layer 460-4, connected to the landing pad 440 that is electrically connected to the fourth semiconductor chip 410-4.

As an example, in the opening 452 and its periphery, the first and second redistribution conductive layers 460-1 and 460-2 may extend toward one side in the first direction, for example, toward the right side. On the other hand, the third and fourth redistribution conductive layers 460-3 and 460-4 may extend toward the other side in the first direction, for example, toward the left side. This may be to prevent an electrical short between the first and second redistribution conductive layers 460-1 and 460-2 and the third and fourth redistribution conductive layers 460-3 and 460-4.

Furthermore, when a plurality of first redistribution conductive layers 460-1 are arranged in a second direction in a plan view, a plurality of second redistribution conductive layers 460-2 may be alternately arranged with the first redistribution conductive layers 460-1 in the second direction to be spaced apart from the first redistribution conductive layers 460-1. This may be to prevent an electrical short between the first redistribution conductive layers 460-1 and the second redistribution conductive layers 460-2. Similarly, when a plurality of fourth redistribution conductive layers 460-4 are arranged in the second direction in a plan view, a plurality of third redistribution conductive layers 460-3 may be alternately arranged with the fourth redistribution conductive layers 460-4 in the second direction to be spaced apart from the fourth redistribution conductive layers 460-4. This may be to prevent an electrical short between the third redistribution conductive layers 460-3 and the fourth redistribution conductive layers 460-4.

Subsequent processes may be substantially the same as those described in FIG. 5.

According to the above embodiments of the present disclosure, it may be possible to provide a semiconductor package capable of reducing process defects while satisfying the requirements for high performance/high capacity with a thin thickness.

Figure 10:
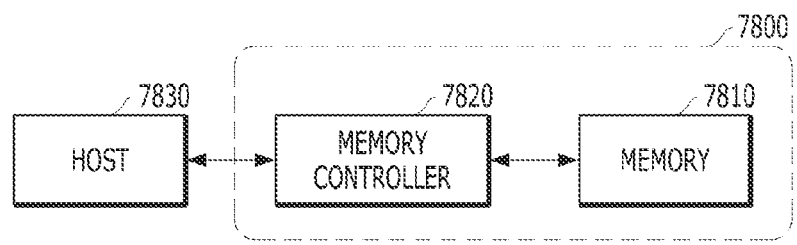
FIG. 10 shows a block diagram illustrating an electronic system employing a memory card including a semiconductor package, according to an embodiment.

FIG. 10 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 11:
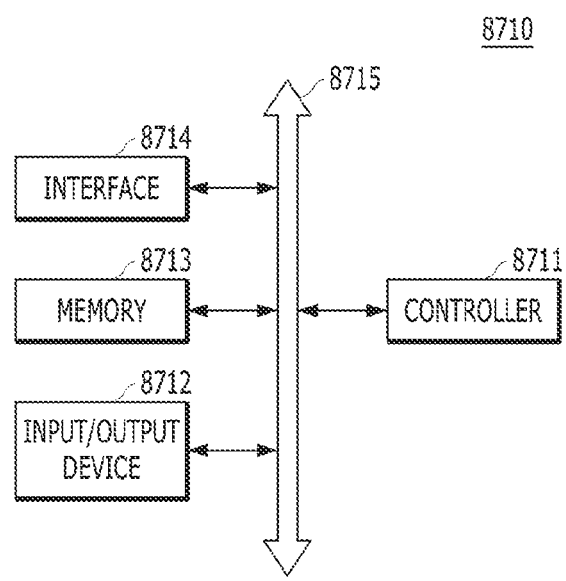
FIG. 11 shows a block diagram illustrating another electronic system including a semiconductor package, according to an embodiment.

FIG. 11 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package comprising:
   at least one semiconductor chip disposed such that an active surface on which a plurality of chip pads are disposed faces a redistribution conductive layer;
   a plurality of vertical interconnectors, each with one end connected to a respective chip pad among the plurality of chip pads, extending in a vertical direction toward the redistribution conductive layer;
   a molding layer covering the semiconductor chip and the vertical interconnectors while exposing an other end of each of the vertical interconnectors that is not connected to the chip pad;
   a plurality of landing pads disposed over the molding layer, and each connected to the other end of each of the vertical interconnectors;
   a redistribution insulating layer covering the molding layer with an opening that collectively exposes the landing pads; and
   the redistribution conductive layer that extends over the molding layer and the redistribution insulating layer while being connected to each of the landing pads.

2. The semiconductor package according to claim 1, wherein the redistribution conductive layer is in direct contact with an upper surface and a side surface of the landing pad.

3. The semiconductor package according to claim 1, wherein the opening exposes the molding layer around the landing pads.

4. The semiconductor package according to claim 1, wherein the opening has a shape that surrounds the landing pads.

5. The semiconductor package according to claim 1, wherein a height of an upper surface of a portion of the redistribution conductive layer that is positioned in the opening is lower than a height of an upper surface of another portion of the redistribution conductive layer that is positioned outside the opening.

6. The semiconductor package according to claim 1, wherein a width of the landing pad is greater than a width of the vertical interconnector.

7. The semiconductor package according to claim 1, wherein a width of a portion of the redistribution conductive layer, which overlaps the landing pad, is smaller than a width of the landing pad.

8. The semiconductor package according to claim 1, wherein a thickness of the redistribution insulating layer is greater than a thickness of the landing pad.

9. The semiconductor package according to claim 1, wherein the at least one semiconductor chip includes first and second semiconductor chips that are stacked in an offset manner in the vertical direction to expose all of the chip pads.

10. The semiconductor package according to claim 9, wherein the redistribution conductive layer includes a first redistribution conductive layer electrically connected to the first semiconductor chip, and a second redistribution conductive layer electrically connected to the second semiconductor chip, and
    wherein the first redistribution conductive layer extends in an opposite direction compared to the second redistribution conductive layer.

11. The semiconductor package according to claim 9, wherein the redistribution conductive layer includes a first redistribution conductive layer electrically connected to the first semiconductor chip, and a second redistribution conductive layer electrically connected to the second semiconductor chip,
    wherein the first redistribution conductive layer extends in the same direction as the second redistribution conductive layer, and
    wherein a plurality of first redistribution conductive layers and a plurality of second redistribution conductive layers are alternately arranged to be spaced apart from each other in a direction that is perpendicular to an extension direction of the first and second redistribution conductive layers.

12. A semiconductor package comprising:
    at least one semiconductor chip disposed such that an active surface on which a plurality of chip pads are disposed faces a redistribution conductive layer;
    a plurality of vertical interconnectors, each with one end connected to a respective chip pad among the plurality of chip pads, extending in a vertical direction toward the redistribution conductive layer;
    a molding layer covering the semiconductor chip and the vertical interconnectors while exposing an other end of each of the vertical interconnectors that is not connected to the chip pad;
    a redistribution insulating layer covering the molding layer with an opening that collectively exposes the other ends of the vertical interconnectors; and
    the redistribution conductive layer that extends over the molding layer and the redistribution insulating layer while being connected to each of the other ends of the vertical interconnectors.

13. The semiconductor package according to claim 12, wherein the redistribution conductive layer is in direct contact with the other end of the vertical interconnector.

14. The semiconductor package according to claim 12, wherein the opening exposes the molding layer around the vertical interconnectors.

15. The semiconductor package according to claim 12, wherein the opening has a shape that surrounds the vertical interconnectors.

16. The semiconductor package according to claim 12, wherein, in the vertical direction, a height of an upper surface of a portion of the redistribution conductive layer that is positioned in the opening, is lower than a height of an upper surface of another portion of the redistribution conductive layer that is positioned outside the opening.

17. The semiconductor package according to claim 12, wherein a width of a portion of the redistribution conductive layer, which overlaps the vertical interconnector, is greater than a width of the vertical interconnector.

18. The semiconductor package according to claim 12, wherein the redistribution conductive layer includes an end portion overlapping the vertical interconnector and a line portion that extends from the end portion, and
    wherein a width of the end portion is greater than a width of the line portion and a width of the vertical interconnector.

19. The semiconductor package according to claim 12, wherein the at least one semiconductor chip includes first and second semiconductor chips that are stacked in an offset manner in the vertical direction to expose all of the chip pads.

20. The semiconductor package according to claim 19, wherein the redistribution conductive layer includes a first redistribution conductive layer electrically connected to the first semiconductor chip, and a second redistribution conductive layer electrically connected to the second semiconductor chip, and wherein the first redistribution conductive layer extends in an opposite direction compared to the second redistribution conductive layer.

21. The semiconductor package according to claim 19, wherein the redistribution conductive layer includes a first redistribution conductive layer electrically connected to the first semiconductor chip, and a second redistribution conductive layer electrically connected to the second semiconductor chip, wherein the first redistribution conductive layer extends in the same direction as the second redistribution conductive layer, and wherein a plurality of first redistribution conductive layers and a plurality of second redistribution conductive layers are alternately arranged to be spaced apart from each other in a direction that is perpendicular to an extension direction of the first and second redistribution conductive layers.

* * * * *